(12) United States Patent
Hasegawa

(10) Patent No.: US 10,840,569 B2
(45) Date of Patent: Nov. 17, 2020

(54) STORAGE BATTERY RACK AND POWER STORAGE DEVICE

(71) Applicant: Panasonic Intellectual Property Management Co., Ltd., Osaka (JP)

(72) Inventor: Takashi Hasegawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 472 days.

(21) Appl. No.: 15/522,315

(22) PCT Filed: Jul. 28, 2016

(86) PCT No.: PCT/JP2016/003501
§ 371 (c)(1),
(2) Date: Apr. 27, 2017

(87) PCT Pub. No.: WO2017/037999
PCT Pub. Date: Mar. 9, 2017

(65) Prior Publication Data
US 2017/0331166 A1     Nov. 16, 2017

(30) Foreign Application Priority Data
Sep. 1, 2015    (JP) .................................. 2015-172263

(51) Int. Cl.
*H01M 10/6557*    (2014.01)
*H01M 10/6563*    (2014.01)
(Continued)

(52) U.S. Cl.
CPC ........ *H01M 10/6557* (2015.04); *H01G 11/10* (2013.01); *H01M 2/1077* (2013.01);
(Continued)

(58) Field of Classification Search
CPC ..... H01G 11/10; H01G 11/18; H01M 10/613; H01M 10/627; H01M 10/647;
(Continued)

(56) References Cited

U.S. PATENT DOCUMENTS

2002/0086202 A1     7/2002   Stone et al.
2002/0192543 A1*   12/2002   Heimer ............... H01M 2/0262
                                                         429/158
2004/0079714 A1*    4/2004   Andrew .............. H01M 2/1077
                                                         211/49.1

FOREIGN PATENT DOCUMENTS

JP         2004-510313         4/2004

OTHER PUBLICATIONS

International Search Report of PCT application No. PCT/JP2016/003501 dated Oct. 11, 2016.

* cited by examiner

*Primary Examiner* — Lingwen R Zeng
(74) *Attorney, Agent, or Firm* — McDermott Will & Emery LLP

(57) ABSTRACT

A storage battery rack includes bottom frame portion, ceiling frame portion, long support posts, and side panels installed facing the support posts. Each support post has a plurality of attachment holes with a predetermined pitch along the longitudinal direction. Side panel has a plurality of female screw holes with a pitch corresponding to the predetermined pitch. Each side panel is attached to a pair of the support posts with screws fastened to attachment holes and the female screw holes. Side panel has a plurality of parallel support portions. A distance between support portions is set substantially equal to a total value of a predetermined height dimension of a refrigerant passage formed between a plurality of storage batteries and a predetermined height dimension of each storage battery.

7 Claims, 10 Drawing Sheets

(51) Int. Cl.
*H01M 10/613* (2014.01)
*H01M 10/627* (2014.01)
*H05K 7/20* (2006.01)
*H01M 2/10* (2006.01)
*H01G 11/10* (2013.01)
*H01M 10/647* (2014.01)
*H01G 11/18* (2013.01)

(52) U.S. Cl.
CPC ....... *H01M 10/613* (2015.04); *H01M 10/627* (2015.04); *H01M 10/647* (2015.04); *H01M 10/6563* (2015.04); *H05K 7/20554* (2013.01); *H01G 11/18* (2013.01); *Y02E 60/13* (2013.01)

(58) Field of Classification Search
CPC ......... H01M 10/6557; H01M 10/6563; H01M 2/1077; H05K 7/20554; Y02E 60/13
See application file for complete search history.

STORAGE BATTERY RACK AND POWER STORAGE DEVICE

This application is a U.S. national stage application of the PCT International Application No. PCT/JP2016/003501 filed on Jul. 28, 2016, which claims the benefit of foreign priority of Japanese patent application 2015-172263 filed on Sep. 1, 2015, the contents all of which are incorporated herein by reference.

TECHNICAL FIELD

The present invention relates to a storage battery rack and an electrical storage device.

BACKGROUND ART

Conventionally, for example, Patent Literature 1 discloses a storage battery rack. This storage battery rack includes a frame and a plurality of shelves, in which batteries respectively mounted on shelves are held by a restraint so as to take earthquake-resistance measures.

CITATION LIST

Patent Literature

PTL 1: Japanese Translation of PCT International Publication No. 2004-510313

SUMMARY OF THE INVENTION

As a rack for housing a plurality of storage batteries as described in PTL 1, it is advantageous in terms of cost to use a conventionally existing standard rack for housing, for example, information equipment, communication equipment, and broadcast equipment.

Such a standard rack is suitable for housing pieces of equipment having a height dimension corresponding to the standard in stages along the vertical direction. However, in order to house storage batteries having non-standard height dimensions with high volumetric efficiency, it is necessary to devise a supporting member for supporting storage batteries in a state in which the storage batteries are mounted. It is also necessary to secure a refrigerant passage through which a medium for cooling a plurality of storage batteries housed in the rack passes.

An object of the present invention is to provide a storage battery rack in which a plurality of storage batteries can be housed with high volumetric efficiency at high energy density using a conventionally existing standard rack while a refrigerant passage is secured, and to provide an electrical storage device.

A storage battery rack of the present invention includes a bottom portion and a ceiling portion disposed facing each other in a vertical direction; at least two long support posts extending between the bottom portion and the ceiling portion to couple the bottom portion and the ceiling portion to each other; and at least two side panels attached to the at least two support posts, the two side panels facing each other. Each of the support posts has a plurality of attachment holes with a predetermined pitch along a longitudinal direction of the support post, each of the side panels has a plurality of through-holes with a pitch corresponding to the predetermined pitch, and the side panels are attached to a pair of the support posts in a state in which fastening members are inserted into the attachment holes and the through-holes. Each of the side panels protrudes in a width direction perpendicular to the vertical direction and has a plurality of support portions which are in parallel to each other. A distance between the support portions is set substantially equal to a total value of a predetermined height dimension of a refrigerant passage formed between a plurality of storage batteries, which are mounted on the support portions and housed, and a predetermined height dimension of each of the storage batteries.

According to a storage battery rack and an electrical storage device using the same in accordance with the present invention, a plurality of storage batteries can be housed with high volumetric efficiency at high energy density while a refrigerant passage is secured, using a conventionally existing standard rack.

DESCRIPTION OF EMBODIMENTS

Hereinafter, an exemplary embodiment in accordance with the present invention is described in detail with reference to the attached drawings. In this description, specific shapes, materials, numerical values, directions, and the like, are just examples for easy understanding of the present invention, and can be appropriately changed depending upon applications of use, purposes, specifications, and the like. Furthermore, in the following, a plurality of exemplary embodiments, modifications, or the like, are included, characteristics thereof are expected to be appropriately combined from the beginning.

Hereinafter, in FIG. 1 and other drawings, a direction of an arrow X showing one direction on a horizontal plane is referred to as a "width direction," a direction of an arrow Y showing a direction perpendicular to the arrow X is referred to as a "length direction," and a direction of an arrow Z showing a direction perpendicular to the arrows X and Y is referred to as a "vertical direction" or a "height direction". Furthermore, with reference to the length direction, one side is referred to as "front" and the other side is referred to as "back".

Figure 1:
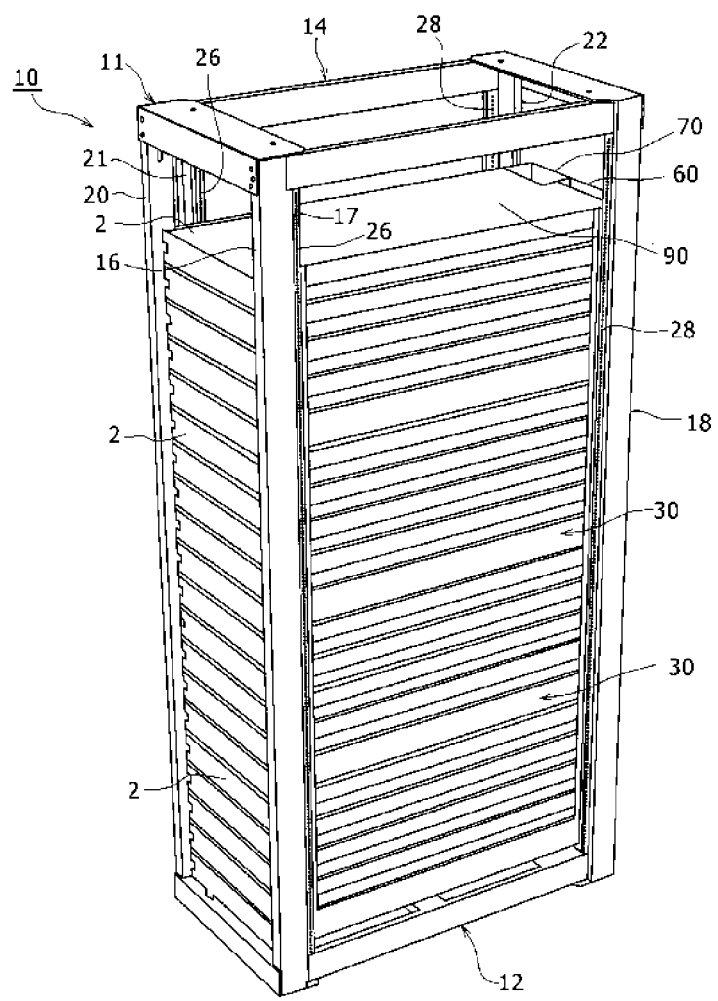
FIG. 1 is a perspective view showing an electrical storage device including a storage battery rack viewed obliquely from the front in accordance with one exemplary embodiment of the present invention.
Figure 2:
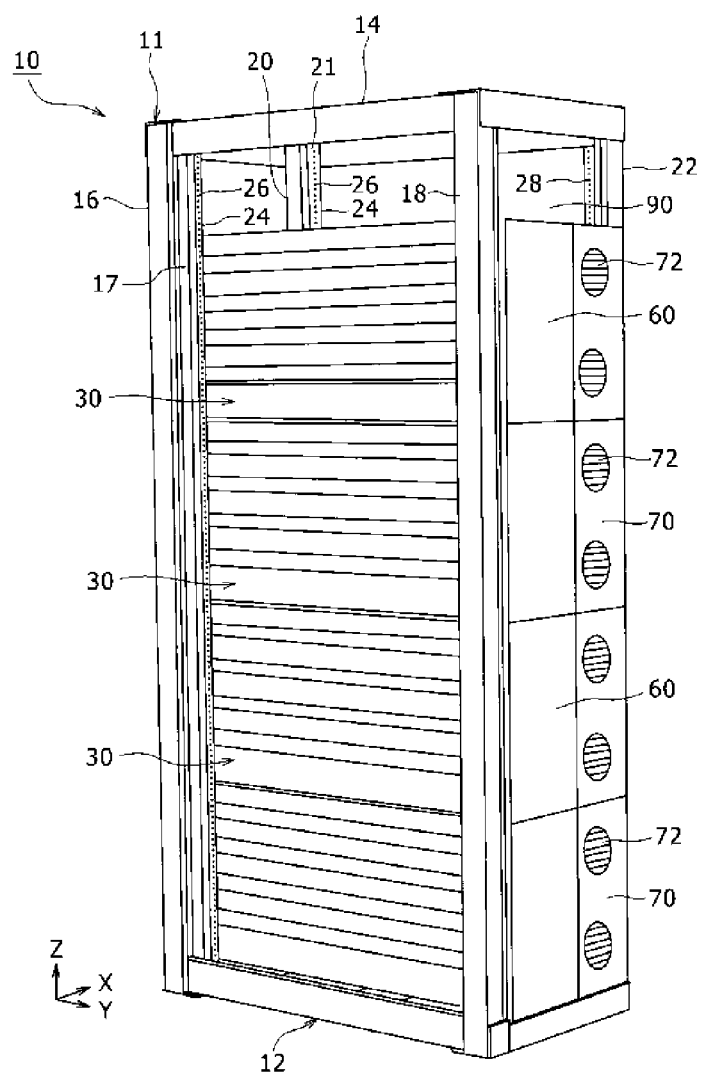
FIG. 2 is a perspective view showing the electrical storage device shown in FIG. 1 viewed obliquely from the back.

FIG. 1 is a perspective view showing electrical storage device 1 including a storage battery rack (hereinafter, appropriately referred to as only a "rack") 10 in accordance with one exemplary embodiment of the present invention viewed obliquely from the front. Electrical storage device 1 shown in FIG. 1 includes rack 10 housing a plurality of storage batteries 2 in stages in the vertical direction. FIG. 2 is a perspective view showing electrical storage device 1 viewed obliquely from the back. Furthermore, FIG. 3 is a perspective view showing rack 10 in a state in which the storage batteries are not housed viewed as in FIG. 1.

Storage batteries 2 are housed in rack 10 of the exemplary embodiment such that, for example, a large number of cylindrical secondary batteries are connected in series, or in parallel, or in combination of series and parallel. Rack 10 of this exemplary embodiment is expected to house, for example, 20 of such storage batteries 2 arranged at a predetermined interval in the vertical direction. However, the number of storage batteries 2 to be housed in one rack 10 is not necessarily limited thereto, it may be appropriately changed depending on an outer dimension and rated capacity of each storage battery 2, a dimension of a refrigerant passage necessary for securing the cooling performance with respect to each storage battery.

Figure 3:
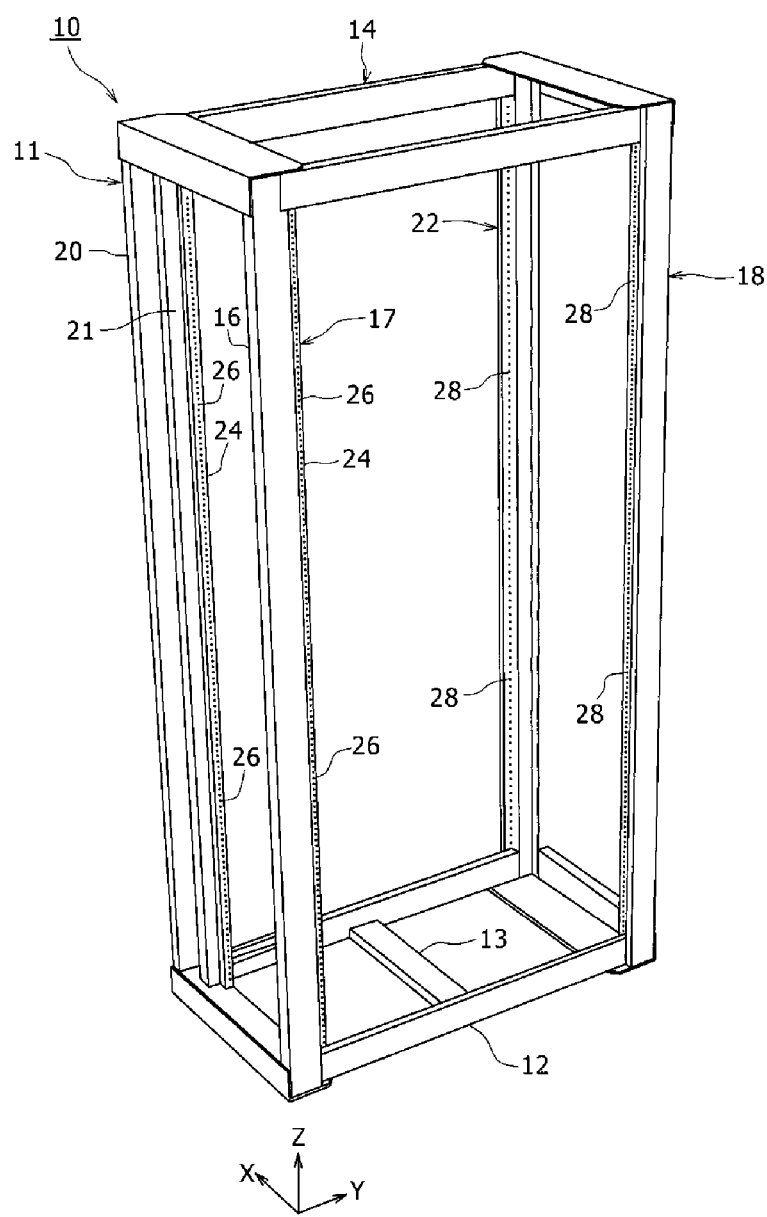
FIG. 3 is a perspective view as in FIG. 1, showing a rack in a state in which the storage batteries are not housed.

As shown in FIGS. 1 to 3, rack 10 includes bottom frame portion (bottom portion) 12, ceiling frame portion (ceiling portion) 14, as well as four support posts 16, 18, 20, and 22. As rack 10, conventionally existing standard racks, for example, a 19-inch rack, can be used. It is preferable that rack 10 has such strength as to be endurable when a large amount of heavy storage batteries 2 are housed. A rack made of, for example, steel can be suitably used.

Both bottom frame portion 12 and ceiling frame portion 14 are formed in rectangular frame shapes, respectively. Bottom frame portion 12 may be formed by coupling four bottom frames by using a fastening member such as a bolt, or four bottom frames may be formed unitarily with each other in advance. Furthermore, reinforcement frame 13 is disposed in the middle of bottom frame portion 12 along the width direction. Both ends of reinforcement frame 13 are coupled to bottom frame portion 12 by a fastening member such as a bolt.

In this exemplary embodiment, similar to bottom frame portion 12. Ceiling frame portion 14 may be formed by coupling four bottom frames using a fastening member such as a screw and a bolt, or may be formed unitarily with each other in advance. Note here that, this exemplary embodiment shows an example in which ceiling frame portion 14 does not include a ceiling plate, but the configuration is not necessarily limited thereto. In order to reduce deposition of dust, and the like, a ceiling plate for closing the upper surface of ceiling frame portion 14 may be provided as a separate member, or ceiling plate may be unitarily formed. Furthermore, similar to bottom frame portion 12, also in ceiling frame portion 14, a reinforcement frame may be installed in the middle so as to enhance the strength of frame structure body 11.

Four support posts 16, 18, 20, and 22 are provided to stand corresponding to four corner portions of bottom frame portion 12 and ceiling frame portion 14. Each of support posts 16, 18, 20, and 22 is a long member extending along the vertical direction. For example, so-called L-shaped or rectangular U-shaped angles are used. Furthermore, the lower ends and upper ends of support posts 16, 18, 20, and 22 are fastened to bottom frame portion 12 and ceiling frame portion 14 by, for example, fastening members such as a screw and a bolt, respectively. Thus, bottom frame portion 12, ceiling frame portion 14, and four support posts 16, 18, 20, and 22 constitute frame structure body 11 including frame portions corresponding to 12 sides of the rectangular parallelepiped.

Two support posts 16 and 20, which are located in the front side among the four support posts, have attachment portions 17 and 21, respectively. Attachment portions 17 and 21 are provided with a large number of attachment holes with a predetermined pitch along the vertical direction. Furthermore, two support posts 18 and 22, which are located in the back side among the four support posts have attachment portions provided with a large number of attachment holes with a predetermined pitch. Hereinafter, two support posts 16 and 20 of rack 10 may be referred to as a front support post, and the other two support posts 18 and 22 may be referred to as a back support post.

As shown in FIG. 3, attachment portions 17 and 21 of front support posts 16 and 20 have narrow attachment plates 24, respectively. Each attachment plate 24 extends in the vertical direction and projects in the length direction. Attachment plate 24 is provided with a large number of attachment holes 26 with a predetermined pitch. In the side surfaces that face each other of back support posts 18 and 22 of rack 10, a large number of attachment holes 28 are formed with a predetermined pitch similar to the above. FIG. 3 shows only attachment holes 28 formed on the side surface of back support post 22.

When rack 10 is a 19-inch rack that conforms to the EIA standard (American National Standards Institute), the rack can house device whose width dimension is up to about 482.6 mm (19 inches). That is to say, it is suitable that the width dimension of storage battery 2 to be housed in rack 10 is about 480 mm. Furthermore, in a case of the EIA standard, the height dimension of the device to be housed is specified in a unit 1 U (=1.75 inches (44.45 mm)), and the height dimension of the device corresponding to the EIA standard is a multiple number of 1 U. In such a rack of the EIA standard, the pitches of attachment holes include a wide pitch and a universal pitch. The pitch of the attachment holes in the wide pitch is repetition of pitches of 31.75 mm (1.25 inches) and 12.7 mm (0.5 inches). In the universal pitch, an attachment hole is added in the middle position between the two attachment holes of 31.75 mm-pitch in the wide pitch. That is to say, in this case, the pitch of the attachment hole is a repetition of 15.9 mm, 15.9 mm, and 12.7 mm. This exemplary embodiment shows an example in which the above-mentioned attachment holes 26 and 28 are formed at universal pitch.

Note here that when the rack is a 19-inch rack matching JIS standard (Japanese Industrial Standards), the rack can house device whose width dimension is up to about 480 mm. The height dimension of the device to be housed is a multiple number of 1 J (=50 mm). In such a rack of the JIS standard, the attachment holes are formed with a pitch of 50 mm. Furthermore, an attachment hole may be added in the middle position between two attachment holes of 50 mm pitch. In this case, the attachment hole is formed with a pitch of 25 mm.

Figure 4:
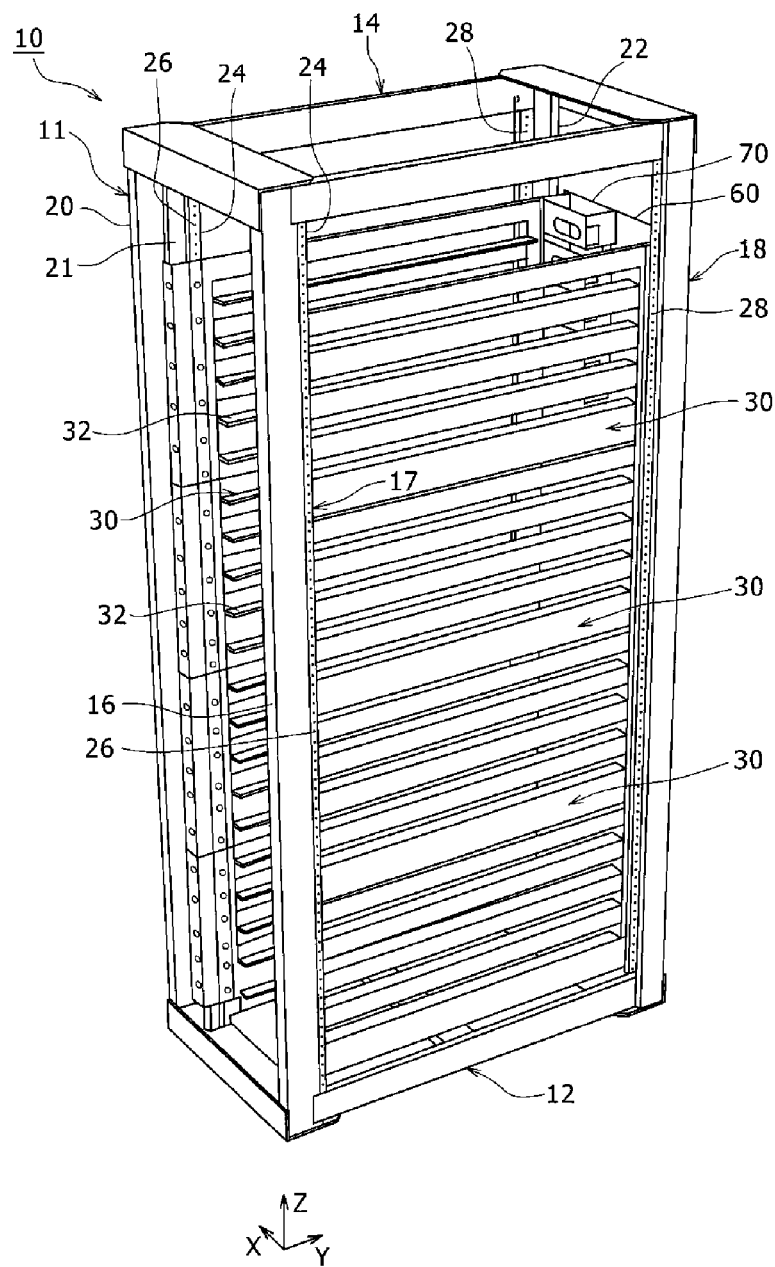
FIG. 4 is a perspective view showing a rack in which side panels, back panels, and fan panels are attached to a frame structure body.

FIG. 4 is a perspective view showing a rack in which a side panel, a back panel, and a fan panel are attached to frame structure body 11.

As shown in FIGS. 1, 2 and 4, rack 10 includes side panels 30. Side panel 30 is installed on a pair of the support posts, that is, front support post 16 and back support post 18, and is installed on the other pair of the support posts, that is, front support post 20 and back support post 22. Thus, side panels 30 constitutes side wall surfaces facing the width direction in rack 10. This exemplary embodiment shows an example in which four each of side panels 30 are attached to the both sides in the width direction of rack 10.

Furthermore, rack 10 may include back panel 60 and fan panel 70. Back panel 60 may be attached to a back wall surface of side panel 30 between back support posts 18 and 22 as mentioned later. Alternatively, back panel 60 may be attached to back support posts 18 and 22. To back panel 60, a connector (not shown) is attached. The connector is electrically connected to electric power input and output terminal of storage batteries 2 to be housed in rack 10 (see FIG. 1).

Fan panel 70 is attached to back panel 60 and back support post 22 using a screw and the like on the back surface of rack 10. As shown in FIG. 2, fan panel 70 is provided with attachment hole 72 having, for example, a circular shape. To this attachment hole 72, fan 74 (see FIG. 10) is attached. Fan 74 has a function of allowing a cooling medium such as air to flow into a refrigerant passage formed between storage batteries 2 when storage batteries 2 are housed in rack 10 by side panel 30. A state in which air as the cooling medium flows in the refrigerant passage between storage batteries 2 is mentioned later.

Figure 5:
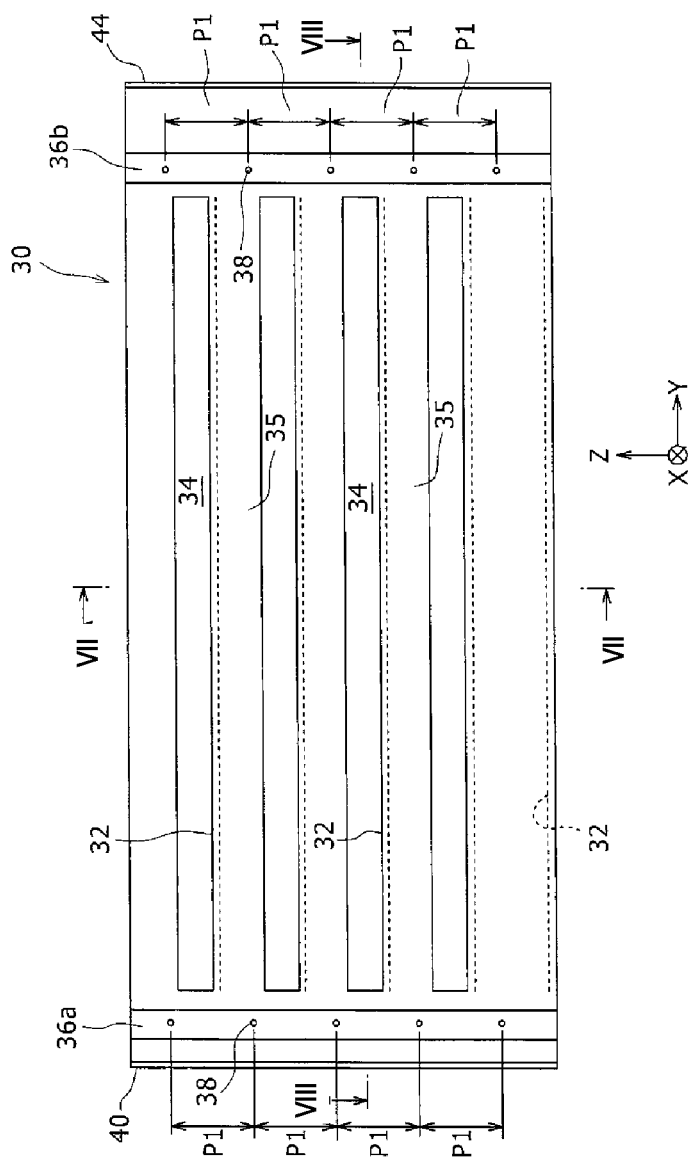
FIG. 5 is a front view of the side panel.
Figure 6:
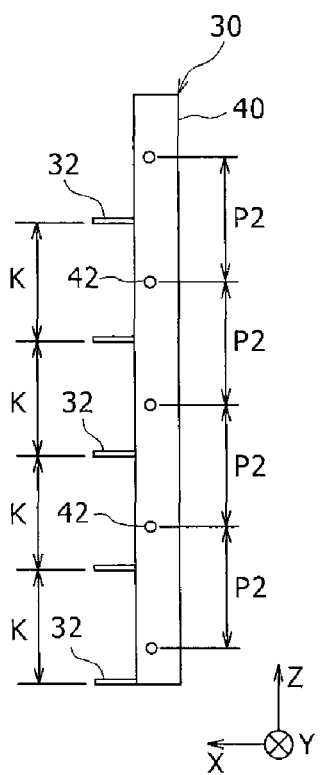
FIG. 6 is a side view of the side panel of FIG. 5 viewed from the front.
Figure 7:
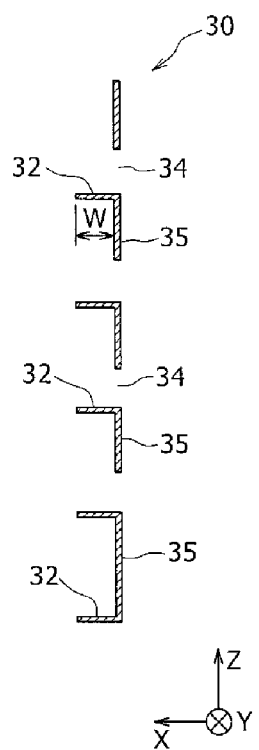
FIG. 7 is a sectional view taken on line VII-VII of FIG. 5.
Figure 8:
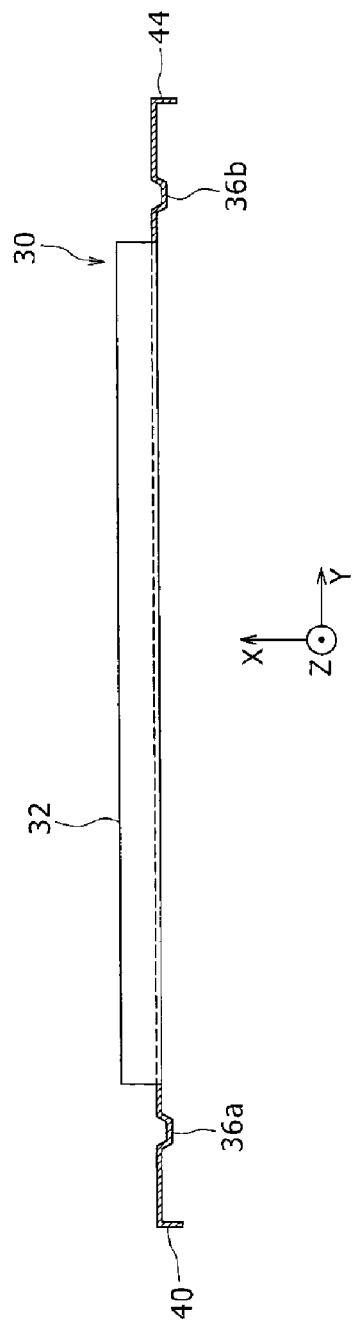
FIG. 8 is a sectional view taken on line VIII-VIII of FIG. 5.
Figure 9:
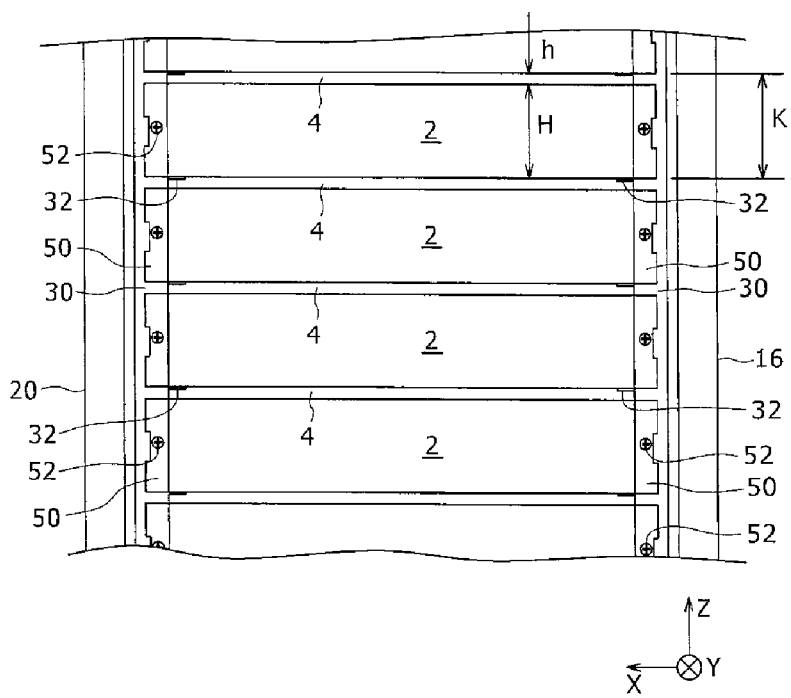
FIG. 9 is a partial front view showing the electrical storage device viewed from the front.

Subsequently, with reference to FIGS. 5 to 9, side panel 30 is described in detail. FIG. 5 is a front view of side panel 30. FIG. 6 is a side view of side panel 30 viewed from the front. Furthermore, FIG. 7 is a sectional view taken on line VII-VII of FIG. 5, and FIG. 8 is a sectional view taken on line VIII-VIII of FIG. 5. Furthermore, FIG. 9 is a partial front view of electrical storage device 1 viewed from the front.

In rack 10, side panel 30 attached to the right side viewed from the front and side panel 30 attached to the left side are mirror-symmetrical to each other. Accordingly, in the following, side panel 30 attached to the right side of rack 10 is described as an example.

As shown in FIGS. 5 to 8, each side panel 30 can be formed, for example, by bending one metal plate. Side panel 30 has a plurality of support portions 32. Support portions 32 protrude in the width direction perpendicular to the vertical direction, and are formed in parallel to each other. This exemplary embodiment shows an example in which five support portions 32 are formed on one side panel 30. That is to say, in this exemplary embodiment, five storage batteries 2 can be mounted by a pair of side panels 30 that are attached facing both sides in the width direction in rack 10.

Four support portions 32 among five support portions 32 are formed by bending a portion having a rectangular U-shaped slit in metal plate only at 90° inward. Furthermore, support portion 32 positioned in the lower-most part of side panel 30 is formed by bending lower end portion of the metal body inward in the width direction with a predetermined width.

As shown in FIGS. 6 and 9, distance K between support portions 32 in the vertical direction is set to substantially equal to a total value of a height dimension H of storage batteries 2 and a predetermined height dimension h of refrigerant passage 4 formed between a plurality of storage batteries 2, which are mounted on support portions 32 and housed. Herein, the height dimension of storage batteries 2 is, for example, about 90 mm. Furthermore, it is suitable that a predetermined height dimension of refrigerant passage 4 is, for example, 8 to 10 mm. The height dimension h of refrigerant passage 4 may be set to be larger than such a height dimension. However, the number of storage batteries 2 capable of being housed when a large number of storage batteries 2 are housed in rack 10 is accordingly reduced. On the other hand, when the height dimension h of refrigerant passage 4 becomes smaller than the above-mentioned dimension range, the flow amount of the air as the refrigerant flowing in refrigerant passage 4 is reduced, thus deteriorating the cooling performance of storage batteries 2. Consequently, the height dimension h of refrigerant passage 4 is preferably set to a minimum dimension that can secure the cooling performance with respect to each storage battery while the housing efficiency of rack 10 is increased.

As shown in FIG. 7, the protruding width W of support portion 32 is set to be wide enough to support storage battery 2 when one corner portion at the lower side extending in the length direction of storage battery 2 is mounted. Furthermore, when support portion 32 having such a protruding width W is formed, side panel 30 is provided with opening portions 34 corresponding to four support portions 32 excluding lower-most support portion 32. In this exemplary embodiment, each side panel 30 is provided with four opening portions 34. Each opening portion 34 has a thin elongated rectangular shape extending along the length direction as shown in FIG. 5. Formation of such opening portion 34 allows the side surface of storage battery 2 to be exposed to the outside of rack 10 via opening portion 34 when storage battery 2 is housed. This has advantages of improving heat dissipation from the side surface of storage battery 2. In this case, the entire side surface of storage battery 2 may not be exposed but at least a part may be exposed.

Furthermore, side panel 30 has closed portion 35 as shown in FIGS. 5 and 7. Closed portion 35 is continuous to support portion 32 so as to form a substantially L-shaped cross section and is suspended in the vertical direction. Closed portion 35 has a function of closing the opening portions at both sides in the width direction of refrigerant passage 4 formed between storage batteries 2 housed in rack 10. Thus, a refrigerant passage between the storage batteries housed in rack 10 can be formed as a passage that opens in the forward and backward directions, and the flowing direction of the air as a refrigerant can be defined. Note here that this exemplary embodiment shows an example in which closed portion 35 closes the entire opening portions at both sides in the width direction of refrigerant passage 4. However, the configuration is not necessarily limited to this, and a closed portion may close a part of the opening portions on both sides in the width direction of refrigerant passage 4 and open the other parts as an air passage portion.

As shown in FIGS. 5 and 8, attachment portion 36a is formed at the front side in the width direction of side panel 30, and attachment portion 36b is formed at the back side in the width direction. Attachment portions 36a and 36b are formed by bending a metal plate in substantially a rectangular U-shape, and extend along the vertical direction. Then, attachment portions 36a and 36b have, for example, five female screw holes (through-holes) 38 in the vertical direction with a predetermined pitch P1. The predetermined pitch P1 is set corresponding to the pitch of attachment holes 26 formed in attachment portions 17 and 21 of front support posts 16 and 20. That is to say, when rack 10 is a 19-inch rack conforming to the EIA standard, the pitch P1 of female screw holes 38 of side panel 30 is preferably, for example, a pitch of 1U (=44.45 mm). Thus, side panel 30 can be attached to front support posts 16 and 20 by screws inserted though attachment hole 26 of front support posts 16 and 20. Note here that when rack 10 is a 19-inch rack conforming to the JIS standard, a predetermined pitch P1 of female screw holes 38 of side panel 30 is preferably set to, for example, 50 mm. Note here that, this exemplary embodiment describes an example in which a through-hole for attaching side panel 30 to the support post is formed as a female screw hole. However, a configuration is not necessarily limited to this, and the through-hole may be formed as a through-hole through which a bolt is inserted and fastened and fixed by a nut.

As shown in FIGS. 5 and 6, the front end portion of side panel 30 is bent substantially vertically to the outside of the width direction. The bent portion forms front side wall 40 of side panel 30. This front side wall 40 has, for example, five female screw holes 42 arranged in the vertical direction with a predetermined pitch P2. This predetermined pitch P2 can be set equal to a pitch with which storage batteries 2 are housed in rack 10 in stages (for example, 20 stages). When height dimension H of storage batteries 2 to be used in this exemplary embodiment is, for example, 90 mm, and a height dimension h of refrigerant passage 4 formed between storage batteries 2 is, for example, 10 mm, arrangement pitch of storage batteries 2 adjacent to each other in the vertical direction is 100 mm. Therefore, in this case, female screw holes 42 (portion to be fastened) formed on front side wall 40 of side panel 30 may be set with a pitch P2 of 100 mm. Thus, as mentioned below, each storage battery 2 can be fixed to front side wall 40 of side panel 30 via a fixed tab fixed to the front-end side wall of storage batteries 2.

Furthermore, as shown in FIG. 5 and FIG. 8, back end portion of side panel 30 is bent substantially vertically to the outside in the width direction. The bent portion forms back side wall 44 of side panel 30. Similar to front side wall 40, this back side wall 44 may also have, for example, five female screw holes (not shown) arranged in the vertical direction with a predetermined pitch P2. Both end portions in the width direction of back panel 60 can be fixed by inserting the screws through the female screw holes formed in this back side wall 44 and fastening thereof.

Four each of side panels 30 formed as mentioned above are attached to both ends in the width direction of rack 10. Back panel 60 and fan panel 70 are attached to back side wall 44 of side panel 30 using a screw and the like. Thus, rack 10 as shown in FIG. 4 is assembled. In this case, since each side panel 30 has support portions 32 for five storage batteries, assembly becomes specifically easier as compared with the case where one each of rack (shelf) corresponding to each housing device is assembled to frame structure body 11 using a fastening member such as a screw and a bolt.

Then, storage batteries 2 are inserted into rack 10 assembled as mentioned above from the front side, so that the lower-side corner portions of each storage battery 2 are mounted on support portions 32 of side panel 30 at both end sides in the width direction. As shown in FIG. 9, fixed tab 50 is attached on both sides in the width direction of the front end portion in the case of storage batteries 2 by, for example, welding, screwing, or the like. Screw 52 is inserted into the through-hole formed in fixed tab 50, and clamped to female screw hole 42 formed in front side wall 40 of side panel 30. Thus, storage batteries 2 are housed in rack 10 in a state in which refrigerant passage 4 having a predetermined height dimension h is formed between storage batteries 2. Thus, electrical storage device 1 is assembled.

Figure 10:
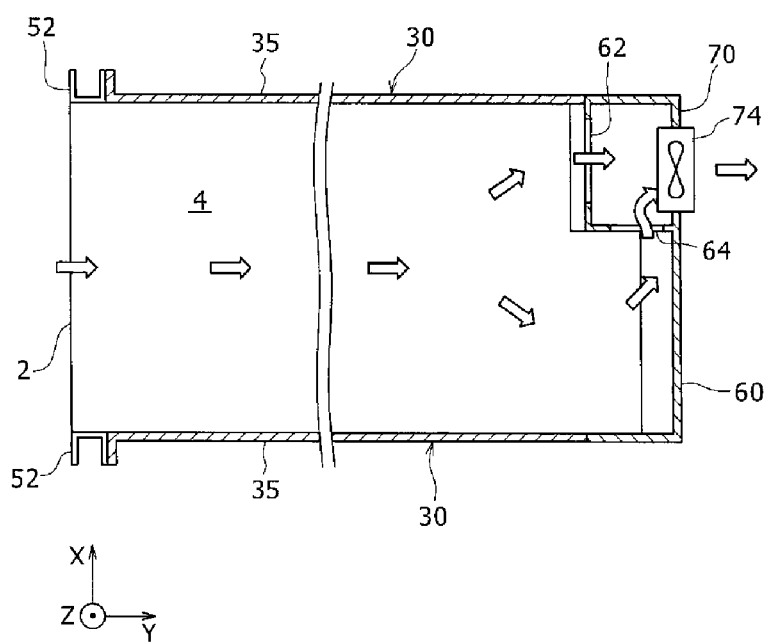
FIG. 10 is a view schematically showing a flow of air in a refrigerant passage.

FIG. 10 schematically shows a flow of air in refrigerant passage 4. As shown in FIG. 10, when fan 74 disposed at fan panel 70 forming the back wall surface of rack 10 is driven, the air is sucked into refrigerant passage 4 from opening portions formed between storage batteries 2, on the front surface of rack 10. As mentioned above, both sides in the width direction of refrigerant passage 4 are closed by closed portion 35 of side panel 30. Therefore, the air entering from the front side of rack 10 into refrigerant passage 4 flows to the back side inside refrigerant passage 4. During this time, the air cools storage batteries 2 located in the upper and lower sides. Thereafter, the air is exhausted to the outside of rack 10 from fan 74 via through-holes 62 and 64 formed in back panel 60.

As mentioned above, according to rack 10 of this exemplary embodiment, using a conventionally existing standard rack (for example, 19-inch rack according to the EIA standard), storage batteries 2 having a non-standard dimension can be housed with high volumetric efficiency and at high energy density while refrigerant passage 4 is secured. Therefore, as compared with the case where a special-purposed rack corresponding to the dimensions of storage batteries 2 is produced, cost necessary for a rack can be remarkably reduced.

Furthermore, in rack 10 of this exemplary embodiment, since a plate-like side panel 30 is installed between front support posts 16 and 20 and back support posts 18 and 22, the structural strength of rack 10 is improved, and a large number of heavy storage batteries 2 can be housed in the vertical direction.

Furthermore, as shown in FIGS. 1 and 2, in electrical storage device 1, in a state in which a predetermined number of storage batteries 2 are housed in rack 10, excessive space 90 can be provided in the upper section of rack 10. By using such excessive space, it is possible to dispose control circuit device and the like for controlling input and output of electric power of each storage battery 2 or monitoring a state. In this way, effective use of excessive space generated by housing non-standard storage batteries enables a plurality of storage batteries 2 including a storage battery-related device to be compactly housed.

Note here that the present invention is not limited to the above-mentioned exemplary embodiment and the modification thereof, modifications and variations can be carried out in the matter described in the claims of the present application and an equivalent scope thereof.

In the example mentioned above, side panel 30 is attached such that it is installed between two support posts 16 and 18 and between two support posts 20 and 22. However, the configuration is not necessarily limited to this example. Side panels respectively disposed on side surfaces in the width direction of the storage battery rack may be attached to each one of support posts in the middle part (two support posts in total) in the length direction. In this case, the ceiling portion is not necessarily have a frame shape, and may be formed of, for example, L-letter angle, rectangular U-shaped angle, pipe, bar material, and the like, which are coupled to the left and right two support posts.

Furthermore, when a plurality of electrical storage devices is disposed adjacent to each other in the width direction, adjacent support posts may be shared by the two electrical storage devices. In this case, in the configuration of the two electrical storage devices, the total number of the support posts of the storage battery rack may be, for example, six, that is, three in the front and three in the back.

Furthermore, in the above-mentioned configuration, storage batteries 2 housed in storage battery rack 10 are housed at an equal pitch, and the height dimensions h of all refrigerant passages 4 are set to the same as each other. However, the configuration is not necessarily limited to this. For example, the height dimension of the refrigerant passage located in the distant from fan 74 is set to be larger than the height dimension of the refrigerant passage near fan 74 so as to improve the cooling performance.

The invention claimed is:

1. A storage battery rack comprising:
a bottom portion and a ceiling portion disposed facing each other in a vertical direction;
at least two long support posts extending between the bottom portion and the ceiling portion to couple the bottom portion and the ceiling portion to each other; and
at least two side panels attached to the at least two support posts, the two side panels facing each other,
wherein each of the support posts has a plurality of attachment holes with a predetermined pitch along a longitudinal direction of the support post, each of the side panels has a plurality of through-holes with a pitch corresponding to the predetermined pitch, and the side panels are attached to a pair of the support posts in a state in which fastening members are inserted into the attachment holes and the through-holes,
each of the side panels protrudes in a width direction perpendicular to the vertical direction and has a plurality of support portions which are in parallel to each other, and a distance between adjacent support portions is set substantially equal to a total value of a predetermined height dimension of a refrigerant passage formed between a plurality of storage batteries, which are mounted on the support portions and housed, and a predetermined height dimension of each of the storage batteries, wherein the support portions are integrally formed with the side panels,
wherein the support portions are formed so as to protrude by bending a part of one metal plate in the width direction perpendicular to the vertical direction,
wherein each side panel has a closed portion which is bent from each of the support portions and extends in the vertical direction, and the closed portion is formed so as to close at least a part of the refrigerant passage that opens in both side surfaces in the width direction of a structure of the rack, and
wherein the side panel comprises the closed portion, and an opening portion between the support portions that are adjacent in the vertical direction to the closed portion, for exposing at least a part of a side surface of the storage battery, and the opening portion as a hole is formed at the side panel by the bending the part of the one metal plate, and the one closed portion is a remaining portion in the one metal plate except the opening portion.

2. The storage battery rack according to claim 1, wherein the side panel has a front side wall extending in the vertical direction and being along the width direction, and the front side wall has portions to be fastened for fixing the storage batteries with a pitch equal to a pitch with which the storage batteries are housed.

3. An electrical storage device comprising a plurality of storage batteries disposed in the storage battery rack according to claim 1.

4. The electrical storage device according to claim 3, wherein the storage batteries each include a plurality of secondary batteries housed in a case and supported by the support portion of the side panel, and are disposed in the storage battery rack.

5. The electrical storage device according to claim 4, wherein the storage batteries are disposed so as to close at least a part of opening portions of the side panel.

6. The electrical storage device according to claim 4, wherein the case of one of the storage batteries has a fixed tab to be fixed to a front side wall of the side panel, at a front end
the front side wall of the side panel has portions to be fastened to which fastening members are fastened via the fixed tabs, and
the portions to be fastened are provided with a pitch equal to a pitch with which the storage batteries are housed.

7. The storage battery rack according to claim 1,
wherein the side panel includes attachment portions formed by bending a metal plate in substantially a rectangular U-shape, and bending directions with respect to the vertical direction of the attachment portions and the support portions are substantially opposite from each other.

* * * * *